(12) United States Patent
Brun et al.

(10) Patent No.: US 8,012,795 B2
(45) Date of Patent: Sep. 6, 2011

(54) METHOD AND DEVICE FOR FABRICATING AN ASSEMBLY OF AT LEAST TWO MICROELECTRONIC CHIPS

(75) Inventors: Jean Brun, Champagnier (FR); Benoît Lepine, Grenoble (FR); Bruno Mourey, Coublevie (FR); Dominique Vicard, Saint Nazaire les Eymes (FR)

(73) Assignee: Commissariat à l'Energie Atomique, Paris (FR)

( * ) Notice: Subject to any disclaimer, the term of this patent is extended or adjusted under 35 U.S.C. 154(b) by 252 days.

(21) Appl. No.: 12/379,357

(22) Filed: Feb. 19, 2009

(65) Prior Publication Data

US 2009/0227069 A1 Sep. 10, 2009

(30) Foreign Application Priority Data

Mar. 6, 2008 (FR) ..................................... 08 01234

(51) Int. Cl.
*H01L 21/00* (2006.01)
*H01L 21/50* (2006.01)
(52) U.S. Cl. .. 438/107; 438/113; 438/464; 257/E21.599
(58) Field of Classification Search .................. 438/107, 438/113, 458, 460, 464; 257/777, E21.599
See application file for complete search history.

(56) References Cited

U.S. PATENT DOCUMENTS

| | | | | |
|---|---|---|---|---|
| 5,923,535 A | * | 7/1999 | Shimada et al. | 361/749 |
| 6,351,028 B1 | * | 2/2002 | Akram | 257/686 |
| 6,777,797 B2 | * | 8/2004 | Egawa | 257/686 |
| 6,932,136 B1 | | 8/2005 | Kelkar et al. | |
| 7,309,623 B2 | * | 12/2007 | Tan et al. | 438/110 |
| 2004/0115430 A1 | | 6/2004 | Leonard | |
| 2009/0200066 A1 | * | 8/2009 | Vicard et al. | 174/255 |

FOREIGN PATENT DOCUMENTS

| | | |
|---|---|---|
| JP | A 2006-257422 | 9/2006 |
| WO | WO 02/084617 A1 | 10/2002 |
| WO | WO 2008/025889 A1 | 3/2008 |

* cited by examiner

*Primary Examiner* — Tuan N. Quach
(74) *Attorney, Agent, or Firm* — Oliff & Berridge, PLC

(57) ABSTRACT

The method enables an assembly of chips, initially formed on a wafer, to be formed. Each chip comprises two parallel main faces joined by side faces. At least one of the side faces comprises at least one groove for housing a thread element. The wafer is first of all stuck onto a flexible film and the chips are then cut. The film is then deformed to space the chips apart from one another and to make the grooves accessible. A daisy chain is then formed joining the chips via at least one thread element, each chip being inserted in the daisy chain by inserting the thread in the groove of said chip and then removing the chip from the deformable film.

11 Claims, 6 Drawing Sheets

METHOD AND DEVICE FOR FABRICATING AN ASSEMBLY OF AT LEAST TWO MICROELECTRONIC CHIPS

BACKGROUND OF THE INVENTION

The invention relates to a method and a device for fabricating an assembly of at least two microelectronic chips.

DESCRIPTION OF THE RELATED ART

Numerous techniques currently exist for mechanically and electrically connecting microelectronic chips to one another. The conventional technique consists in making a rigid mechanical connection between the chips once the latter have been formed on a substrate and released by sawing. The chips, then fixed on a rigid support, are then electrically connected before a protective coating is formed. This first approach, consisting in making the connection on a rigid support, is conventionally used when there is a great complexity in connection of the chips. However this approach has the major drawback of using a rigid mechanical support which is particularly unsuitable for integration in flexible structures.

A second approach, described in the document WO-A-02/084617 consists in integrating chips on a set of fibres or thread elements to form a device. This integration of the chips in the fibres can be achieved by coating. The different chips can be connected to one another by means of conducting filaments also able to be coated or integrated in the fibre itself. However this document does not indicate how fixing of the filaments of conducting material between the different chips and coating on the fibres are to be performed.

BRIEF SUMMARY OF THE INVENTION

The object of the invention is to provide a method for fabricating an assembly of microelectronic chips with a high production rate.

According to the invention, this object is achieved by the appended claims and more particularly by the fact that said chips being made on a wafer and each chip comprising two parallel main faces joined by side faces, at least one of the side faces comprising at least one groove, the method comprises the following successive steps:
  sticking the wafer onto a flexible film,
  cutting the chips,
  deformation of the flexible film in the proximity of at least one groove of at least one chip to make the groove accessible,
  embedding a thread element in said groove of said chip, arranged in an insertion area,
  and removing the chip from the flexible film in a removal area.

According to a development of the invention, deformation of the film, located downline from a input area, is performed by inclining the flexible film near said groove, on entry or on exit.

Deformation of the film can be achieved by stressing by traction causing stretching of the film at least in an input area.

The invention also relates to a device for fabricating an assembly of at least two microelectronic chips said chips being made on a wafer and each chip comprising two parallel main faces joined by side faces, at least one of the side faces comprising at least one groove, the device comprises
  means for sticking the wafer on a flexible film,
  means for cutting the chips,
  means for deforming the flexible film in the proximity of at least one groove of at least one chip to make the groove accessible,
  means for embedding a thread element in said groove of said chip arranged in an insertion area,
  and means for removing the chip from the flexible film in a removal area.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PREFERRED EMBODIMENTS

Figure 1:
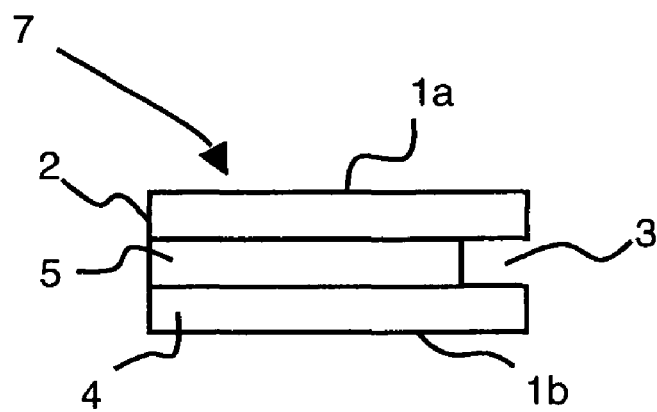
FIGS. 1 to 6 represent two alternative embodiments of chips able to be used to form a daisy chain according to the invention.

The invention uses microelectronic chips of the type described in International Patent application PCT/FR2007/001034, claiming priority of French Patent application n°607588 filed on 29 Aug. 2006. These chips are used to constitute an assembly in the form of a daisy chain. As illustrated in FIG. 1, the microelectronic chip comprises at least one microelectronic component 4. The microelectronic chip has two parallel main faces 1a and 1b connected by side faces 2 forming the edge of the chip. The number of side faces 2 can vary and depends on the shape of the outline of main faces 1a and 1b. At least one of the side faces comprises at least one groove 3, preferably parallel to main faces 1a and 1b. This groove is dimensioned in such a way as to enable insertion of an element of thread form.

Figure 2:
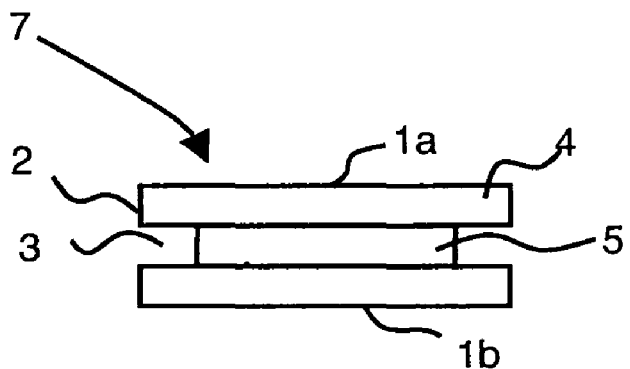

As illustrated in FIG. 2, a chip 7 can have two grooves 3 respectively made on two opposite side faces. Each groove respectively enables insertion of an element of thread form.

A chip according to FIGS. 1 and 2 can also be in the form of an assembly of two microelectronic components 4 or of a microelectronic component 4 and a counterplate joined by a spacer 5. The spacer is of smaller width than the width of the chips, enabling one groove 3 (FIG. 1) or two grooves 3 (FIG. 2) to be obtained on each side of spacer 5.

Each groove of each chip can be presented inclined, the axis of the thread element, once the latter is embedded in the groove, remaining substantially parallel to the main faces.

Embedding of a thread element can be performed by force, the element then being held in place mechanically, or by simple insertion after which securing is performed by sticking the thread element in the groove.

Figure 3:
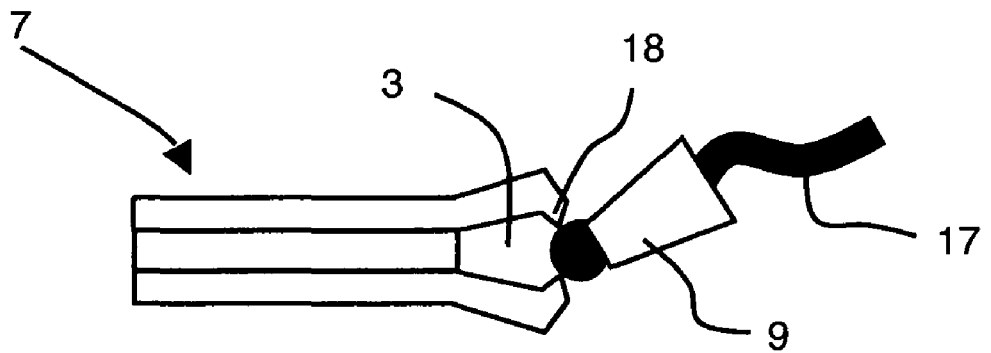
Figure 4:
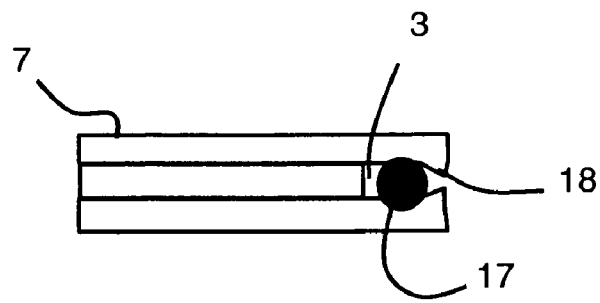

According to an alternative embodiment of the chip illustrated in FIGS. 3 and 4, the groove of chip 7 can be deformed elastically when thread element 17 is inserted. Then, by flexible return, the groove pinches thread element 17 which is then embedded in groove 3 of the chip. Advantageously, groove 3 can comprise salient elements 18 at its two longitudinal ends for ease of inserting the thread element and preventing the latter from coming adrift.

The thread element is preferably inserted in the groove of chip 7 by a thread-bearing needle 9 that guides thread element 17 into the groove and/or exerts a pressure on thread element 17 to force insertion thereof in groove 3. Embedding of the thread element can required a certain space and it may then be necessary to make the access to the grooves sufficiently large to let the thread-bearing needle or any other device for inserting the thread element pass.

Figure 5:
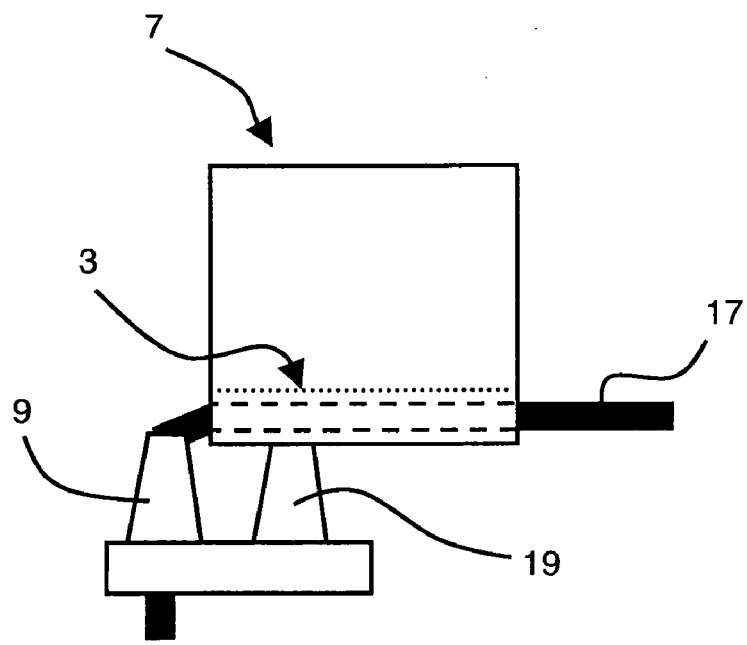

The thread element can be embedded in the groove of a chip 7 by soldering, sticking or deposition of a polymer. As an example illustrated in FIG. 5 corresponding to a top view of a chip 7, the thread element is inserted in groove 3 by a thread-bearing needle 9 and a syringe 19 then deposits the glue or polymer in the groove to seal thread element 17 in the groove.

Figure 6:
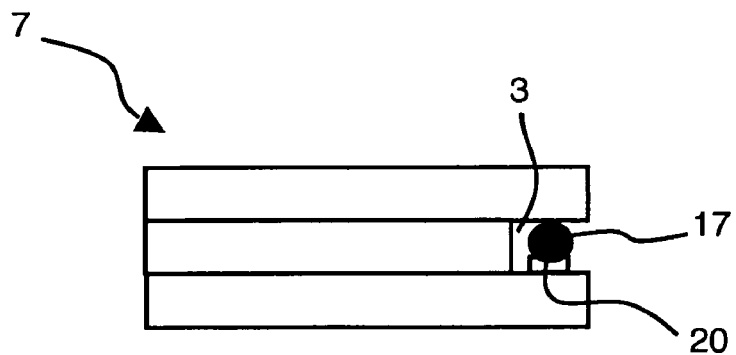

The groove of a chip can be electrically conducting enabling power to be supplied to the chip or acting as data bus when the thread element, itself electrically conducting, is in electric contact with the groove. For example purposes, FIG. 6 illustrates a chip the groove whereof comprises at least one electric connection pad 20 (i.e. a bump) extending over at least a part or over the whole of groove 3. The thread element 17 can then be electrically in contact with pad 20.

In order to optimize the contact between the pad and the thread element, the latter can undergo electrolysis or be sealed in an electrically conducting glue or a polymer.

According to an alternative embodiment (not shown), the thread element can be partially inserted in a groove and only connect two adjacent chips, connection with another chip being performed by another thread element.

Figure 7:
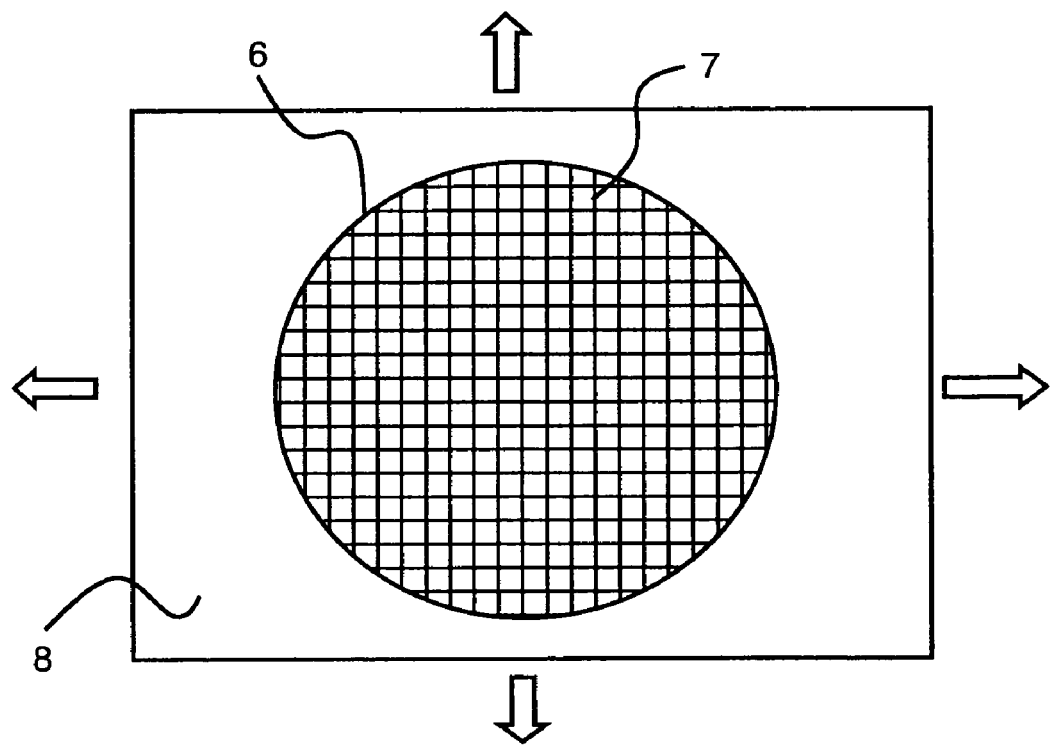
FIGS. 7 and 8 illustrate the different steps of producing a daisy chain of chips according to the invention.
Figure 8:
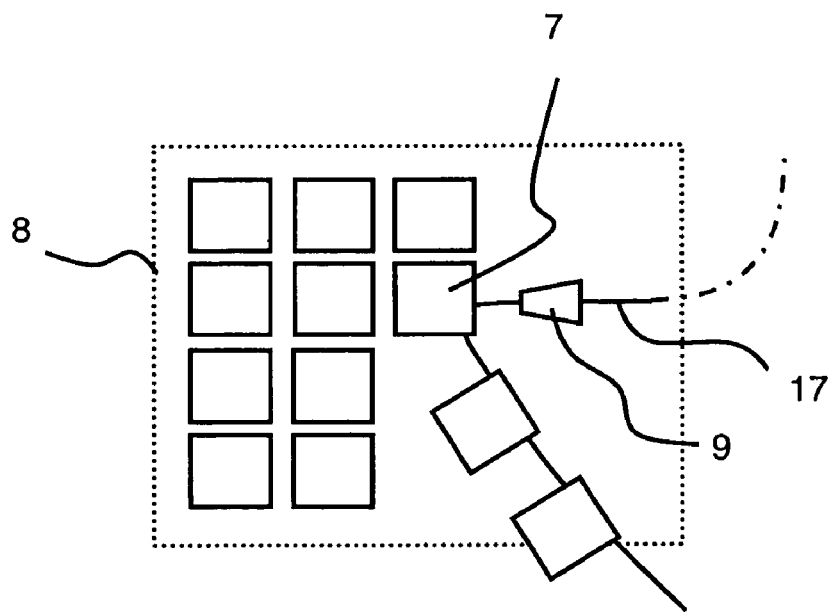

As illustrated in FIG. 7, the microelectronic chips 7 as described above are made side by side on a silicon wafer 6. To make a daisy chain of chips, the method for fabricating an assembly of at least two microelectronic chips as described above, illustrated in FIGS. 7 to 13, comprises the following successive steps:

silicon wafer 6 on which chips 7 were made is stuck onto a flexible film 8, the film being able to be stuck before the chips are made on the wafer or after the chips have been made, the chips, preferably initially made in die matrix form on wafer 6, are cut, but do however remain mechanically attached to one another by means of flexible film 8 on which they are stuck. This cutting can be performed using any suitable method, for example by sawing or by plasma etching, deformation of flexible film 8 in proximity to at least one groove 3 of at least one chip to make groove 3 accessible, embedding of at least one thread element 17 in said groove 3 of said chip, arranged in an insertion area 12, and removing (i.e. unsticking of the chip) the chip from flexible film 8 in a removal area 13.

The last three steps can be repeated until the daisy chain has the required length.

According to a development, the insertion and removal areas are identical.

The flexible film can be a polymer film.

Figure 9:
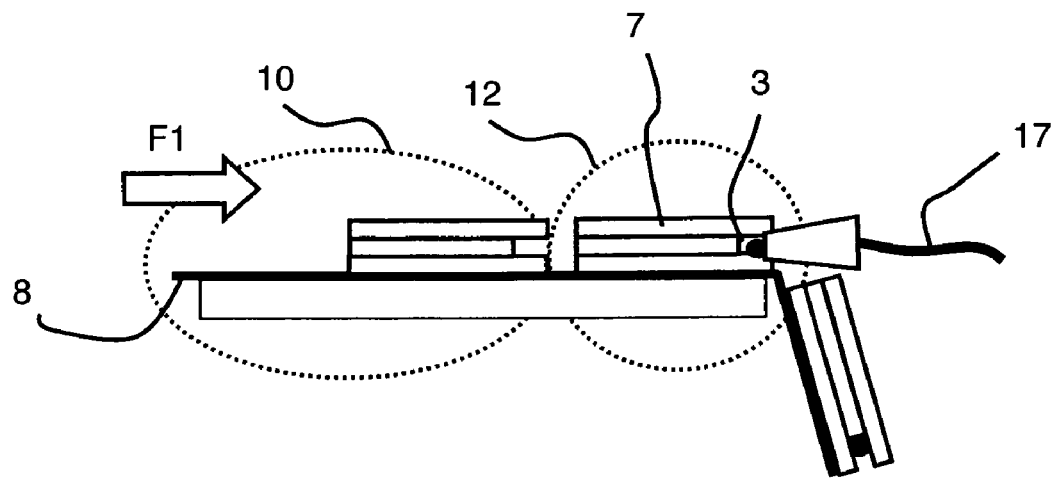
FIGS. 9 to 11 illustrate different variants of a first embodiment of the assembly method.
Figure 10:
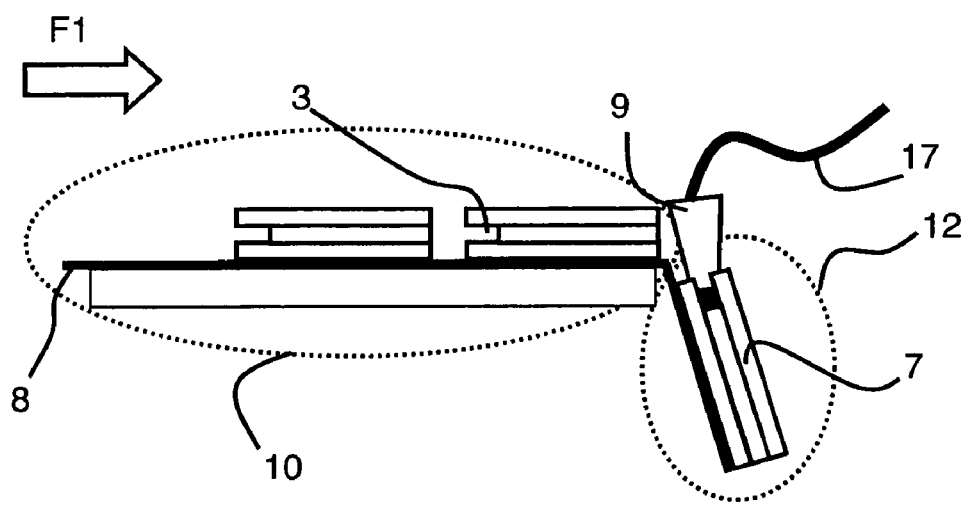
Figure 11:
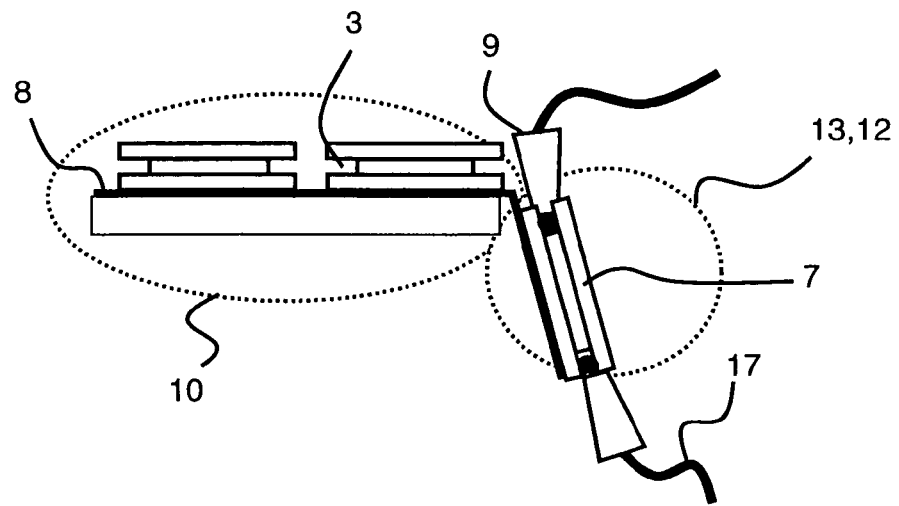

According to an embodiment illustrated in FIGS. 9 to 11, deformation consists in inclining the flexible film at the level of an insertion area 12 to allow access to the grooves. Deformation of the flexible film situated downline from an input area 10 is thus performed by inclining the flexible film 8 in proximity to the groove.

In an alternative embodiment illustrated in FIG. 9, each chip comprises a groove 3 arranged downline in the direction of running of flexible film 8 indicated by arrow F1. To enable the thread element to be inserted in the grooves of two adjacent chips, deformation comprises inclining of flexible film 8 at the level of groove 3, thereby making a first chip swing by inclination of the flexible film on exit from insertion area 12, thereby leaving free access to groove 3 of a second chip 7 then placed in insertion area 12. Thread element 17 is then inserted in groove 3 at the level of insertion area 12 located at the break formed by inclination of film 8 on exit from insertion area 12. Once thread element 17 has been inserted, flexible film 8 advances so as to move the chip located in insertion area 12 to the removal area and to move the next chip onto insertion area 12, etc. On exit from insertion area 12, film 8 makes an angle with the direction of running of the chips that is slightly more than 90° in the particular embodiment illustrated in FIG. 9.

According to an alternative embodiment illustrated in FIG. 10, each chip comprises a groove on the upline side of the chip in the direction of running of the flexible film (indicated by arrow F1). In this alternative embodiment, insertion area 12 is inclined with respect to input area 10. The flexible film is inclined at the entry to insertion area 12. Chip 7, in which the thread element is to be inserted, thereby swings towards the insertion area releasing groove 3 and enabling thread element 17 to be inserted. Then flexible film 8 advances to move the next chip to insertion area 12, and the chip in which the thread element was inserted can be moved to a removal area (not shown) or be unstuck at the level of insertion area 12 before a new chip takes its place there.

According to an alternative embodiment illustrated in FIG. 11, each chip comprises two grooves on two opposite side faces, one groove being located upline and the second groove being located downline in the running direction of flexible film 8. In this alternative embodiment, insertion area 12 is inclined with respect to input area 10. Chip 7, in which two thread elements are to be inserted, thereby swings on insertion area 12, releasing the two grooves 3 and enabling the thread elements to be inserted in the two grooves. Flexible film 8 is therefore inclined on entry to insertion area 12. Before the chip is conveyed to insertion area 12, the previous chip is preferably unstuck so as to leave the groove located downline in the running direction of the chips free. The chip can be unstuck in the insertion area 12 (the insertion area 12 and the removal area being thus identical). The chip located in insertion area 12 can also be moved to a removal area located downline, when a next chip reaches insertion area 12 in order to leave the groove located downline in the running direction of the chips free.

To increase the assembly rate of the chips, this embodiment can be applied not to a single chip but to a row of chips, each row of chips moving successively from one area to the other. The use of a row of chips can be also applied to all the embodiments.

Figure 12:
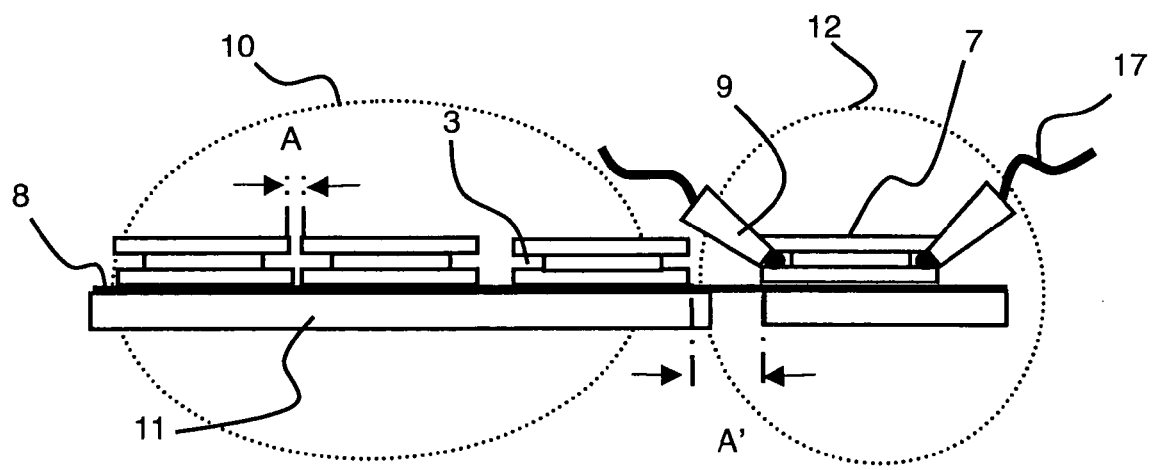
FIGS. 12 and 13 illustrate two variants of a second embodiment of the assembly method.
Figure 13:
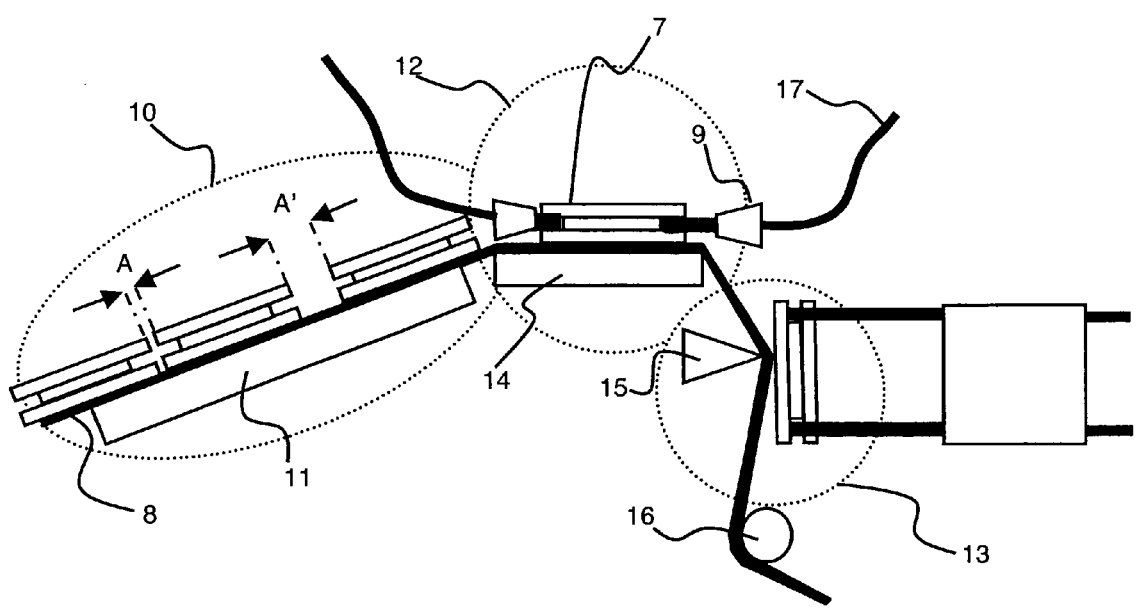

In a second embodiment illustrated in FIGS. 12 and 13, deformation of flexible film 8 is achieved by stressing flexible film 8 by traction resulting in the latter being stretched at least in an input area 10. Once flexible film 8 has been stretched (direction of arrows in FIG. 7) when passing in input area 10, the spacing between two adjacent chips at the level of insertion area 12 is sufficient to allow the thread element and/or thread-bearing needle 9 to pass. The deformation area thus corresponds to input area 10 of chips to insertion area 12.

Flexible film 8 can be a polymer film able to stretch several by tens of percent when it is subjected to a preset temperature. The polymer film can thereby be stressed by traction and/or heated to the temperature enabling it to be stretched. Such a film enables a spacing of a few millimeters to be created between the chips, after the chips have been cut. For example, the stressed film can be moved onto a heating plate 11, preferably at a temperature between 80° C. and 150° C., the stress exerted at a given temperature enabling the chips to be spaced from one another at the level of the grooves. This space can facilitate access to the grooves by at least one thread-bearing needle 9 assisting in inserting thread element 17 in the groove.

As illustrated in FIG. 12, flexible film 8 on which the wafer is stuck, chips 7 of which have been cut, passes successively in at least two different areas forming a production chain enabling the daisy chain production rate to be speeded up. The flexible film is thus first moved to input area 10 able to comprise a heating plate 11. This plate 11, if necessary, heats film 8 to its stretching temperature to create a spacing between the chips. This spacing becomes larger (from A to A' for example) as the film moves in input area 10. Then film 8 is moved into an insertion area 12 of threads 17 in the grooves and finally to a removal area (not shown) to remove the chips 7 forming the daisy chain. The removal area can be the same as the insertion area.

According to an alternative embodiment illustrated in FIG. 13, insertion area 12 comprises a bearing surface 14. Advantageously, this surface 14 is not in the same plane as heating plate 11 to facilitate the passage of thread-bearing needles 9 if stretching is not sufficient to allow the latter to pass. The intersection of the planes respectively formed by heating plate 11 and surface 14 forms an re-entrant angle, this angle preferably being strictly greater than 180° and strictly smaller than 360°. This configuration facilitates movement of thread-bearing needle 9 and insertion of thread 17 in the grooves of each chip.

According to this second embodiment and its variants, the daisy chain production rate can be speeded up by no longer adding a single chip at a time, at each elementary step, but a row of chips. For this, the wafer comprises a plurality of rows of chips substantially parallel to one another and each row of chips passes successively from input area 10 to insertion area 12 and then to removal area 13. In removal area 13, a simple traction on the daisy chain can be sufficient to unstuck the chips.

According to a development applicable to the different embodiments, removal of each chip 7 or of each row of chips is enhanced by the use of a tool 15 in removal area 13 (FIG. 13) reducing the adhesion surface between chip 7 or row of chips and film 8. This tool 15 can be in the form of a blade or a tip exerting pressure on a central area of each chip whereas film 8 is moving by means for moving the film. For example purposes in FIG. 13, a roller 16 on which film 8 presses is arranged on exit from removal area 13 and enables tool 15 to reduce the surface of the chip stuck to the film to make the latter easier to remove.

Although the means for moving the film enable the latter to be stressed by traction, according to the second embodiment realisation illustrated in FIG. 13, the traction remains substantially constant in the input area 10, insertion area 12 and removal area 13. This traction enables the spacings A then A' to be obtained in input area 10, when the film passes on heating plate 11 or is simply stretched by traction.

After removal, the free part of the daisy chain can follow a path enabling various processing operations, for example electrolysis, to strengthen the connections between the threads and chips, or coating with a glue, a polymer, etc.

Each thread element 17 connecting the chips to form the daisy chain can have a diameter of a few micrometers, preferably between 10 μm and 300 μm, suitable for the dimensions of the grooves of the chips. Thread element 17 can be metallic, preferably being formed by at least one metal conductor of Ag, Au, etc type. The thread element can also advantageously be in the form of a strand made up of several elemental threads at least one of which is conducting. The grooves of the chips can then act as electric connection terminals, data busses, etc.

Furthermore, the chips can also integrate connection areas on their top and/or bottom surfaces so as to increase the number of possible connections or to improve their mechanical strength once assembled in daisy chain form.

The thread elements can be polymer insulating threads participating in the mechanical strength or be textile fibres coated with a conducting material.

The thread elements can be hollow, thereby enabling a fluid, preferably liquid or gaseous, to flow in the channel formed by the internal diameter of the thread. The fluid flowing in the channel can for example perform cooling of the chips forming the daisy chain. The use of a cooling system then enables more complex chips operating at higher frequencies to be integrated in the daisy chain.

A daisy chain of microelectronic chips obtained according to the method described above in particular enables a plurality of chips performing a precise common function or a particular function to be associated in a textile. The chips can be of RFID type, the metal thread connecting them then being able to act as antenna in particular providing the power supply.

The invention is not limited to the embodiments described above. In particular, different types of chips coming from different substrates can be connected.

A device of fabrication enables assembly of at least two microelectronic chips produced on a wafer, each chip 7 comprising two parallel main faces 1a and 1b joined by side faces 2. At least one of side faces 2 comprises at least one groove 3, the device comprises:
  means for sticking wafer 6 on a flexible film 8,
  means for cutting chips 7,
  means for deforming the flexible film in proximity to at least one groove of at least one chip to make the groove accessible,
  means for inserting a thread element 17 in said groove 3 of said chip,
  and means for removing the chip from the flexible film in a removal area, said thread element being embedded in the chip.

The invention claimed is:

1. A method for fabricating an assembly of at least two microelectronic chips, wherein said chips are made on a wafer and each chip comprises two parallel main faces joined by side faces, at least one of the side faces comprising at least one groove, the method comprises the following successive steps:
  sticking the wafer onto a flexible film,
  cutting the chips,
  deforming the flexible film in the proximity of the at least one groove of at least one chip to make the groove accessible,
  embedding a thread element in said groove of said chip, arranged in an insertion area,
  and removing the chip from the flexible film in a removal area.

2. The method according to claim 1, wherein deforming the flexible film, located downline from an input area, is achieved by inclining the flexible film in proximity to said groove.

3. The method according to claim 2, wherein the flexible film is inclined on entry to the insertion area.

4. The method according to claim 2, wherein the flexible film is inclined on exit from the insertion area.

5. The method according to claim 1, wherein deformation of the flexible film is achieved by stressing by traction causing stretching of the flexible film at least in an input area.

6. The method according to claim 5, wherein the input area is equipped with a heating plate.

7. The method according to claim 1, wherein the insertion area and removal area are identical.

8. The method according to claim 1, wherein the flexible film is a polymer film.

9. The method according to claim 1, wherein each chip comprises two grooves, respectively made on two opposite side faces, two adjacent chips being connected by two threads, said threads being inserted in the grooves by thread-bearing needles.

10. The method according to claim 1, wherein a wafer is formed by a plurality of rows of chips, each row passing successively from one area to the other.

11. The method according to claim 1, wherein the removal area comprises a removal tool formed by a blade or at least a tip.

* * * * *